United States Patent [19]

Jacobs et al.

[11] Patent Number: 4,717,686
[45] Date of Patent: Jan. 5, 1988

[54] METHOD FOR THE SIMULTANEOUS MANUFACTURE OF BIPOLAR AND COMPLEMENTARY MOS TRANSISTORS ON A COMMON SILICON SUBSTRATE

[75] Inventors: Erwin P. Jacobs, Vaterstetten; Josef Winnerl, Landshut, both of Fed. Rep. of Germany

[73] Assignee: Siemens Aktiengesellschaft, Berlin and Munich, Fed. Rep. of Germany

[21] Appl. No.: 869,306

[22] Filed: Jun. 2, 1986

[30] Foreign Application Priority Data

Jun. 3, 1985 [DE] Fed. Rep. of Germany ....... 3519790

[51] Int. Cl.⁴ .................. H01L 21/265; H01L 21/22; H01L 29/78
[52] U.S. Cl. ........................ 437/56; 357/42; 357/43; 437/31; 437/34; 437/44; 437/45; 437/189; 437/200
[58] Field of Search ................. 29/577 C, 571, 576 B; 148/1.5, 187; 357/42, 43

[56] References Cited

U.S. PATENT DOCUMENTS

| | | | |
|---|---|---|---|
| 4,459,741 | 7/1984 | Schwabe et al. | 29/576 B |
| 4,484,388 | 11/1984 | Iwasaki | 29/571 |
| 4,505,766 | 3/1985 | Nagumo et al. | 148/187 |
| 4,525,920 | 7/1985 | Jacobs et al. | 29/571 |
| 4,536,945 | 8/1985 | Gray et al. | 29/571 |
| 4,604,790 | 12/1986 | Bonn | 29/576 B |
| 4,637,125 | 1/1987 | Iwasaki et al. | 29/571 |

OTHER PUBLICATIONS

Momose et al., IEEE-Trans. Electron Devices, *ED*-32, Feb. 1985, p. 217.
"A 1.0 μm N-Well CMOS/Bipolar Technology for VLSI Circuits" by Miyamoto et al., IEDM Technical Digest (Dec. 1983), pp. 63-66.

*Primary Examiner*—Upendra Roy
*Attorney, Agent, or Firm*—Hill, Van Santen, Steadman & Simpson

[57] ABSTRACT

A method for the simultaneous manufacture of bipolar and complementary MOS transistors on a common silicon substrate, wherein n-doped wells are produced in a p-doped substrate for accepting p-channel transistors and npn bipolar transistors are formed into the n-doped wells, the n-well forming the collector of the transistor and the n-wells overlying buried n+-doped zones which are connected in the bipolar transistor region by more deeply extending collector plugs. A buried part and plug region of the collector are produced before the production of the wells, and the collector region is formed in the substrate in common with the well so the high-temperature step after the conventional LOCOS process is eliminated. The well implantation is self-adjusting relative to the implantation of the deep collector plug which is annularly formed in the well. A reduction of the collector series resistance as well as an increased latch-up hardness is obtained. Further, the parasitic substrate-pnp is reduced. The method is particularly useful for the manufacture of VLSI circuits with high switching speeds.

21 Claims, 14 Drawing Figures

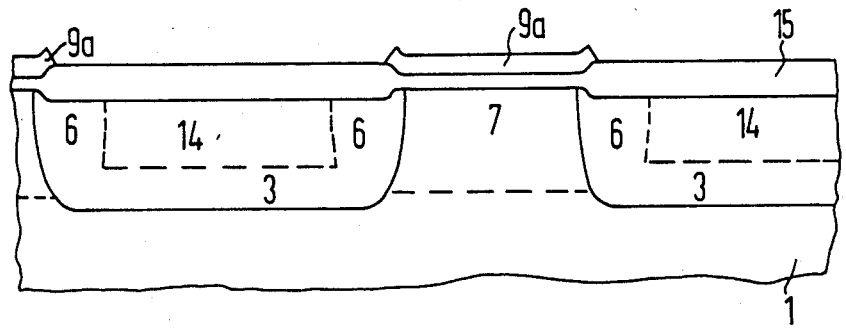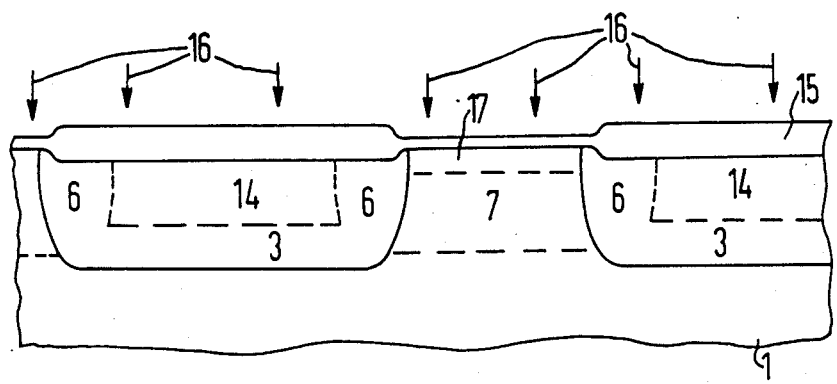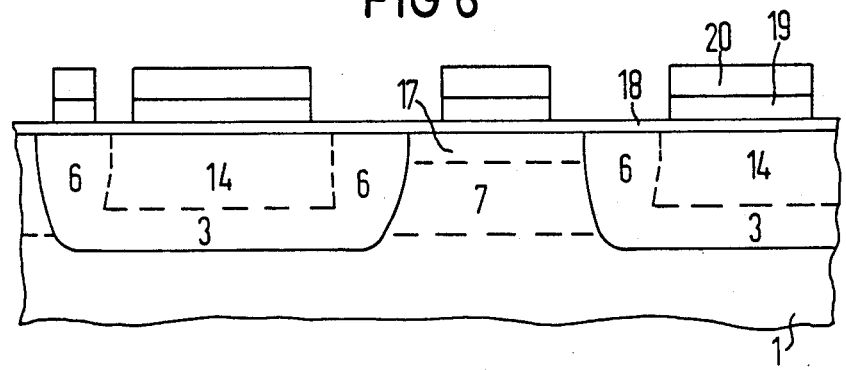

METHOD FOR THE SIMULTANEOUS MANUFACTURE OF BIPOLAR AND COMPLEMENTARY MOS TRANSISTORS ON A COMMON SILICON SUBSTRATE

BACKGROUND OF THE INVENTION

1. Field of the Invention

This invention relates to a method for the simultaneous manufacture of bipolar and complementary MOS transistors on a common silicon substrate.

2. Description of the Prior Art

A method for forming 1.0 micron well CMOS/bipolar transistor assemblies for VLSI circuits is described, for example, in an article by Miyamoto et al in IEDM 1983, Technical Digest (December 1983) pages 63 through 66. A buried collector is employed for diminishing the collector resistance, the buried collector being connected by means of a deep collector contact.

In the manufacture of this known transistor arrangement, a collector with a highly doped contact region is generated by means of a series of process steps. Due to the annealing process for generating the deep collector contact, which is performed after the LOCOS process for producing an insulating oxide for separating the active transistor regions, a temperature load is provided which has a disadvantageous effect on the component structures. A lateral parasitic substrate-pnp also arises which, among other things, increases the latch-up feedback susceptibility.

SUMMARY OF THE INVENTION

The present invention seeks to avoid the disadvantages of the prior art by means of a series of steps which makes it possible to manufacture vertical npn and lateral pnp bipolar transistors and complementary MOS transistors on the same chip.

In general, the method includes the following steps:
(a) providing a p-doped silicon substrate,
(b) applying a surface-wide double insulation layer composed of silicon dioxide and silicon nitride over the substrate,
(c) photolithographically structuring the silicon nitride layer,
(d) forming a deeply extending collector region in the substrate by deep implantation of the substrate with n-doping ions,
(e) removing the silicon nitride structure from the substrate,
(f) implanting n-doping ions into the substrate to form n-wells in the regions from which the silicon nitride was removed,
(g) diffusing in n-doping ions into the substrate while simultaneously oxidizing the surfaces of the n-wells to form oxide masks,
(h) removing the silicon nitride layer and performing deep channel implantation of boron ions into the substrate through the oxide masks,
(i) applying a double layer of silicon dioxide and silicon nitride over the substrate,
(j) structuring the silicon nitride layer to open the active regions and selectively masking by photoresist selected regions of the opened area,
(k) implanting boron ions through the mask provided in the preceding steps to dope the field oxide regions of the n-channel transistors to be formed,
(l) removing the photoresist mask provided previously and locally oxidizing the substrate to form field oxide regions for separating the active transistor regions of the substrate, utilizing the previously applied silicon nitride as a mask,
(l') applying a photoresist mask to define the base of the bipolar transistor,
(m) implanting boron ions to form base zones in the bipolar transistor region,
(n) removing the photoresist mask and oxidizing the substrate surface-wide to produce a gate oxide thereon,
(o) implanting boron ions surface-wide to dope the channel regions of the n-channel and p-channel MOS transistors,
(p) depositing a gate material surface-wide to provide the gate electrodes of the MOS transistors and then structuring the gate by photolithography and etching,
(q) vapor depositing a surface-wide layer of silicon dioxide to form an intermediate oxide,
(r) selectively implanting n-doping ions to form source/drain regions of the n-channel transistors and the n+ emitter and the n+ collector contact of the bipolar transistors having masked before all other regions by photoresist,
(s) removing the photoresist mask and selectively implanting boron ions to form source/drain regions of the p-channel transistors and the p+ base contact of the bipolar transistors having masked before all other regions by photoresist, and
(t) removing the photoresist mask, etching the contact holes, and performing usual metallization technique. This is followed by the usual step of passivation.

In some instance, the process can also include the initial steps of producing buried n+-doped zones in the p-doped substrate by implantation of n-doping ions, followed by a surface-wide application of a p-doped epitaxial layer.

The method described above represents a very advantageous variation of the method disclosed by German OS No. 33 14 450 A1 (U.S. Pat. No. 4,525,920, issued July 2, 1985) for the manufacture of LSI complementary MOS field effect transistors, but contains method steps which enable the simultaneous manufacture of bipolar transistors on the same chip.

The following advantages are achieved by the method of the present invention over, for example, the method known from the previously mentioned article by Miyamoto:

1. The high temperature step to anneal the collector contact after the LOCOS process is eliminated due to the common drive-in of the n-well and the deep collector plug.
2. Because of the self-adjusting well implantation relative to the formation of the deeply extending collector plug, the latter exists in the form of an annular ring around the well.
3. The well resistance is reduced due to the annular collector plug in combination with the buried collector. This leads to both a reduction of the collector series resistance of the bipolar transistor as well as to an increased latch-up hardness of the circuits.
4. The parasitic substrate-pnp is vertically reduced by the buried collector and is laterally reduced by the annular collector plug. The latch-up hardness is thereby further increased.

5. The reduced substrate-pnp transistor permits the use of a lateral pnp-transistor in the n-well.

BRIEF DESCRIPTION OF THE DRAWINGS

The process involved for the simultaneous manufacture of bipolar and complementary MOS transistors on a common chip is set forth in greater detail with reference to the sequence of method steps shown in FIGS. 1 through 14. The method steps are shown combined in section in the Figures, and the same reference characters are provided for identical parts where appropriate.

DESCRIPTION OF THE PREFERRED EMBODIMENTS

Figure 1:
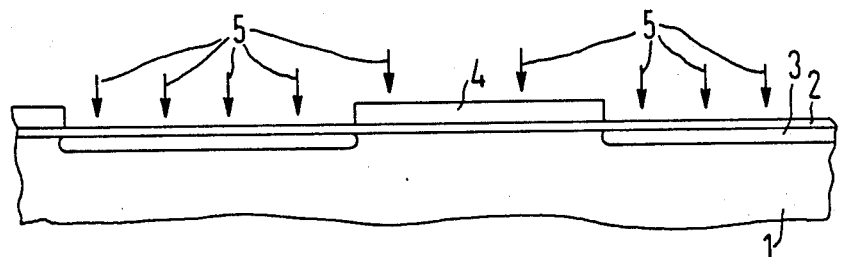

In FIG. 1, there is illustrated a monocrystalline p-doped (100) oriented silicon substrate wafer 1 having a specific electrical resistance of about 20 ohm cm and an $SiO_2$ layer 2. The buried collector region 3 is produced with the aid of a photoresist mask 4 in the usual manner, utilizing an antimony ion implantation with a dosage level of $3 \times 10^{15}$ $Sb^+$ $cm^{-2}$ and at an energy level of 80 keV as illustrated by the arrows labeled 5.

Figure 2:
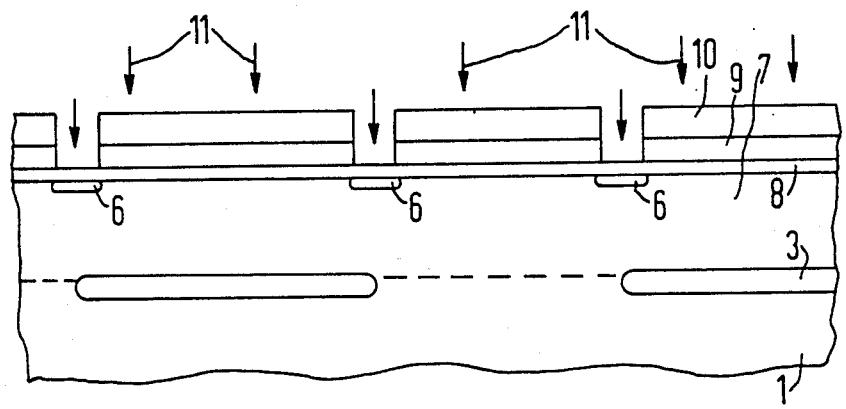

In FIG. 2, reference numeral 6 indicates a deep collector terminal which is produced after the removal of the $SiO_2$ layer 2. A 3 micron thick $p^-$- doped epitaxial layer 7 having a specific electrical resistance of about 20 ohm cm is deposited on the structure shown in FIG. 1. The epitaxial layer 7 is covered with an insulating double layer composed of an $SiO_2$ layer 8 having a thickness of about 50 nm, and a 140 nm thick chemically vapor deposited silicon nitride layer 9. By means of a photoresist technique using a mask 10, the nitride layer 9 is structured and the deep collector implantation takes place as indicated by the arrows 11 using phosphorus ions with a dosage of about $3 \times 10^{15}$ $cm^{-2}$ at an energy level of about 80 keV. This represents a departure from known processes.

Figure 3:
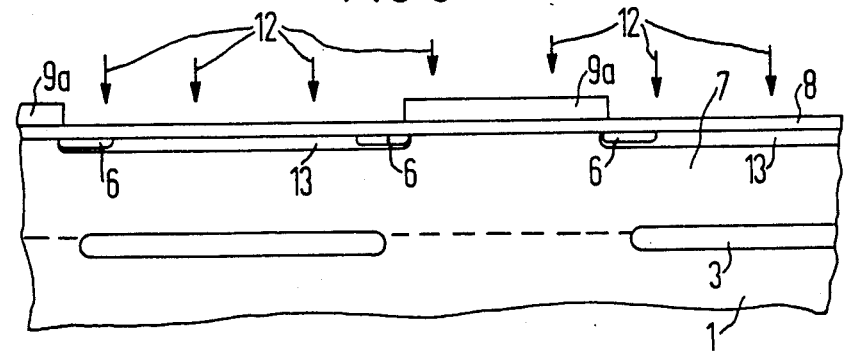

In FIG. 3, there are shown the steps involved in producing an n-well region identified at reference numeral 14 in FIG. 4. First, there is a phosphorus ion implantation as indicated by the arrows 12 with a dosage of about $2 \times 10^{12}$ $cm^{-2}$ and at an energy level of about 180 keV after the photoresist process (not shown) has taken place, with removal of the nitride structures over the n-well regions 14. The nitride structure 9a remains and the implanted regions 13 are formed.

In the following stages, FIG. 4, there are the steps of oxidation for masking the well regions 13, the inner diffusion of the antimony and phosphorus ions, i.e., the generation of the n-well 14 and the collector contact 6. There is produced an $SiO_2$ layer 15 on the surface, with the nitride structure 9a serving as a mask. At a high temperature of about 1150° C., the collector plug region is driven at least 2.5 microns and preferably about 3 microns into the substrate 1 so that the buried collector region 3 can be reached reliably.

In FIG. 5, there is shown a sequence which occurs after removal of the silicon nitride structure 9a. The first deep implantation of the double channel implantation of the n-channel transistors is produced by means of a surface-wide deep implantation as indicated by the arrows 16 with boron ions, with a dosage of $8 \times 10^{11}$ $cm^{-2}$ and an energy level of 60 keV. The $SiO_2$ layer 15 acts as a mask. There is thus produced a p-doped region 17 under the channel.

As indicated in FIG. 6, this procedure is followed by the production of a double layer 18,19 composed of thermally grown $SiO_2$ to a thickness of about 50 nm over which there is a layer of silicon nitride measuring about 140 nm. The structuring of the silicon nitride layer 19 occurs through the use of a photoresist mask 20 for the subsequently occurring local oxidation (LOCOS).

Figure 7:
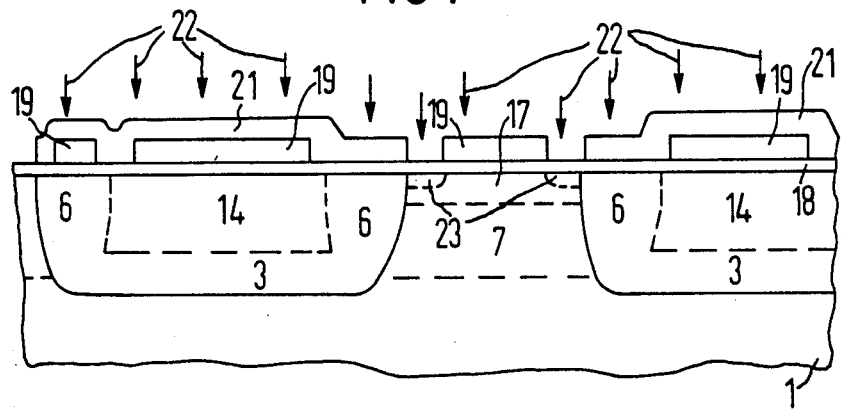

FIG. 7 represents the field doping in the n-channel region, produced by a boron ion implantation as indicated by the arrows 22 at a dosage level of $1.2 \times 10^{13}$ $cm^{-2}$, and an energy level of 25 keV, using a photoresist process which utilizes a mask 21. The p-doped regions 23 are thereby produced.

Figure 8:
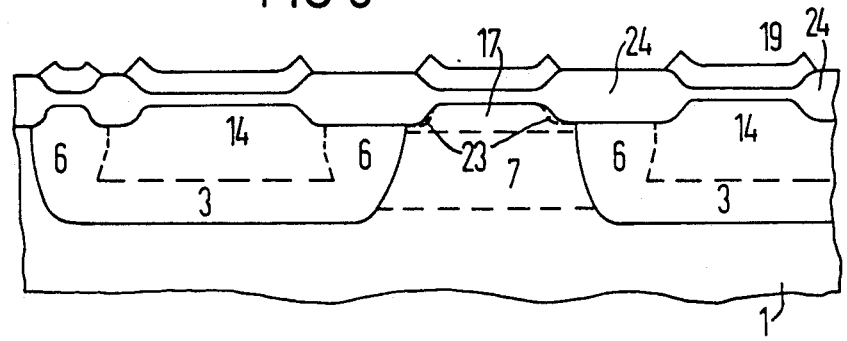

After removal of the photoresist mask 21, the field oxide required for separating the active transistor regions in the substrate 1 is generated on the $SiO_2$ layer 18 by local oxidation using the silicon nitride structure 19 as a mask. The oxide layers have been identified with reference numeral 24 in FIG. 8.

Figure 9:
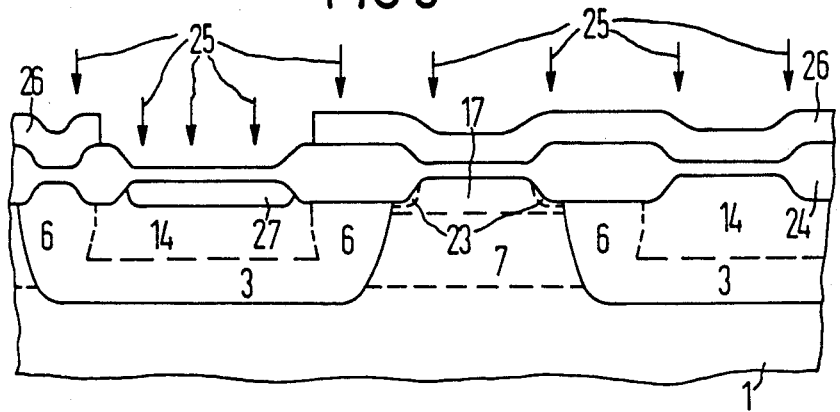

FIG. 9 illustrates the condition for the base implantation of the bipolar transistor using a photoresist mask 26. The implantation is indicated by the arrows 25 and occurs with boron ions having a dosage of $9 \times 10^{13}$ $cm^{-2}$ and an energy level of 80 keV. This results in a p-doped base region 27.

Figure 10:
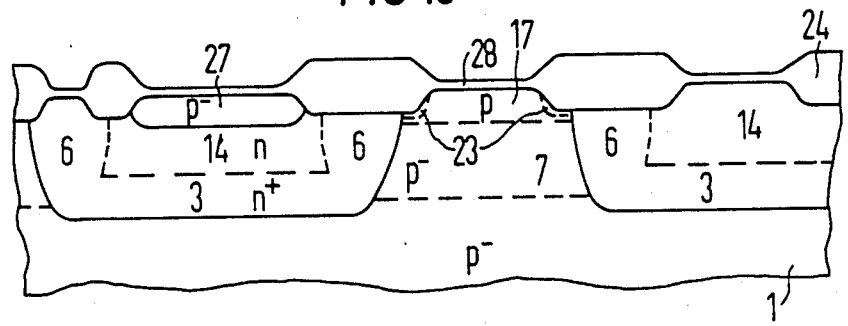

In FIG. 10, there is a representation of the gate oxidation process which follows after the removal of the photoresist mask 26 and the oxide layer 18. The thickness of the gate oxide 28 is preferably in the range from 10 to 25 nm.

Figure 11:
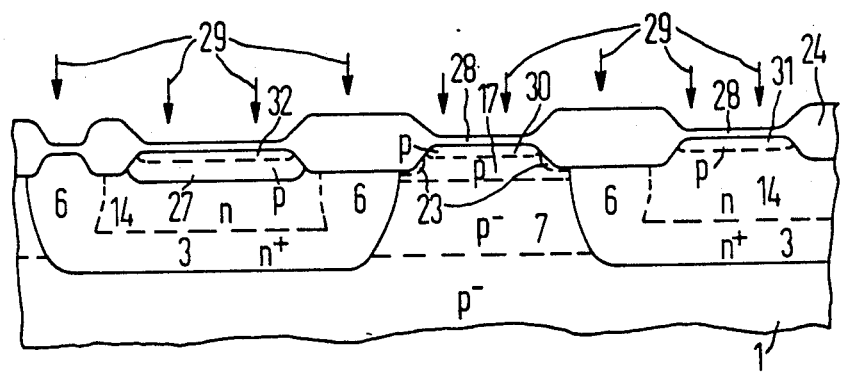

Channel regions 30 and 31 of the MOS transistors and the p-region 32 in the base of the bipolar transistor are produced as illustrated in FIG. 11. This involves a surface-wide, second flat channel implantation as indicated by the arrows 29 with boron ions having a dosage of about $2 \times 10^{11}$ $cm^{-2}$ with an energy level of 25 keV. The corresponding dopings are identified in the showing of FIG. 11.

Figure 12:
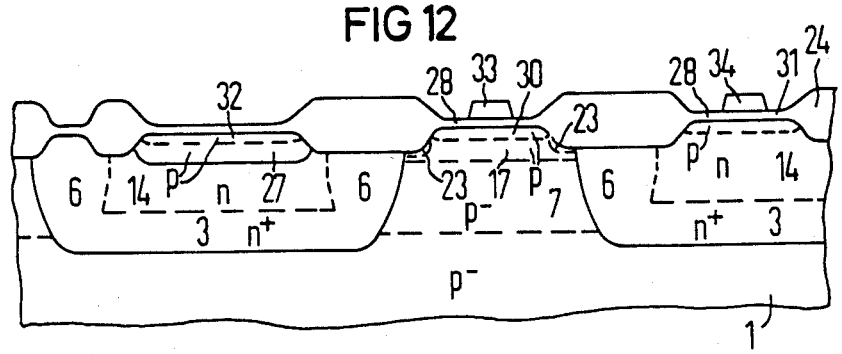

Gate electrodes 33 and 34 of the MOS transistors are generated as illustrated in FIG. 12 by a surface-wide tantalum disilicide deposition. The electrodes may consist of a refractory metal, a refractory metal silicide, or double layers of polysilicon and silicides. The electrodes 33,34 are subsequently structured by using a conventional photoresist process.

Figure 13:
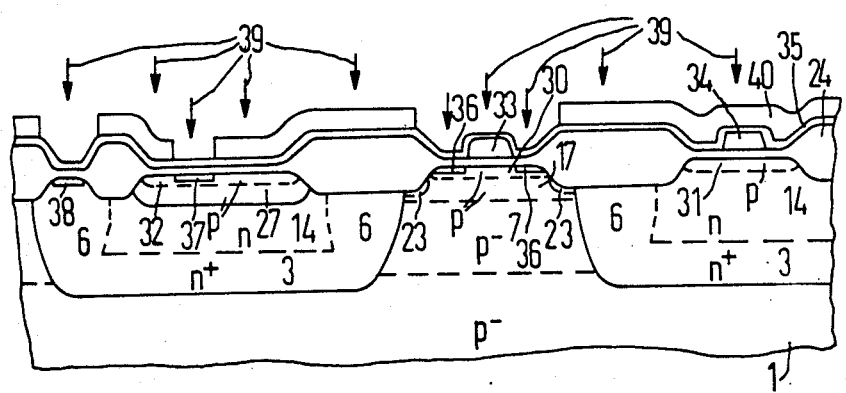

As illustrated in FIG. 13, an intermediate oxide 35 is then generated by surface-wide deposition of $SiO_2$ from the vapor phase. It has been found advantageous to produce the layer 35 by thermal decomposition of tetraethyl orthosilicate, thereby producing a conforming spacer layer 35 having a thickness of from 50 to 200 nm and preferably about 100 nm. The simultaneous production of the source/drain regions 36 of the n-channel transistors, the emitter 37, and the $n^+$ collector contact region 38 of the bipolar transistor then occurs by phosphorus ion implantation as indicated by the arrows 39 at a dosage level of $8 \times 10^{15}$ $cm^{-2}$ and an energy level of 80 keV. This implantation occurs after the remaining regions (p-channel transistors, bipolar transistor region with the exception of the collector and emitter contact regions 38 and 37) have been masked with a photoresist mask 40.

Figure 14:
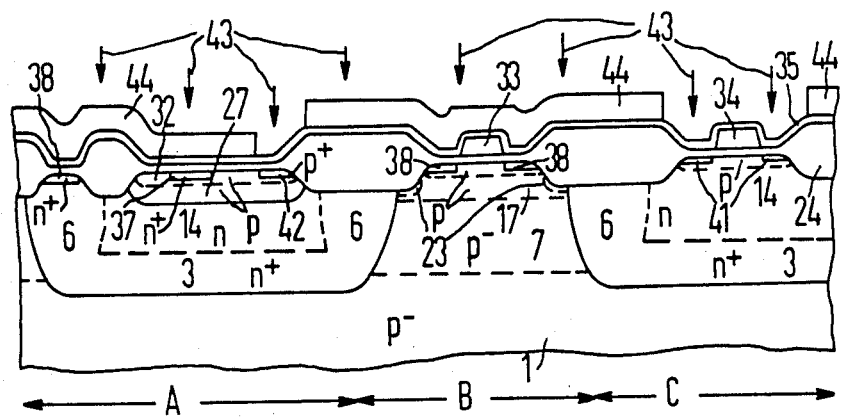

In FIG. 14, there is illustrated a process analogous to that shown in FIG. 13. In this Figure, the source/drain regions 41 of the p-channel transistors and the $p^+$ base contact region 42 of the bipolar transistor are produced by a boron ion implantation as indicated by the arrows 43 with a dosage of $4 \times 10^{15}$ $cm^{-2}$ and an energy level of 40 keV. The n-channel transistor regions and the bipolar transistor region, with the exception of the $p^+$ base contact region 42, are covered by means of a photoresist mask 44.

The letters A, B and C appearing in FIG. 14 mark the regions of the bipolar transistor A, the n-channel transistor B, and the p-channel transistor C.

It is also possible in one embodiment of the method of this invention to proceed on the basis of a p-doped substrate having a specific electrical resistance of 0.02 ohm cm and to omit the implantation shown in FIG. 1 for producing the buried collector. With a substrate having an initial specific resistivity of 20 ohm cm, it is possible to omit the implantation step shown in FIG. 1, and not use the epitaxial layer 7 shown in FIG. 3. The process is simplified by eliminating the buried collector, and the annular collector plug provides an improvement in the collector resistance and the latch-up hardness in comparison to traditional processes which do not use a buried collector.

It should be evident that various modifications can be made to the described embodiments without departing from the scope of the present invention.

We claim as our invention:

1. A method for the simultaneous manufacture of bipolar and complementary MOS transistors on a common silicon substrate which comprises, in sequence:
   (a) providing a p-doped silicon substrate,
   (b) applying a surface-wide double insulation layer composed of silicon dioxide and silicon nitride over said substrate,
   (c) photolithographically structuring said silicon nitride layer,
   (d) forming a deeply extending collector region in said substrate by deep implantation of said substrate with n-doping ions through said silicon nitride,
   (e) removing the silicon nitride structures from said substrate,
   (f) implanting n-doping ions into said substrate to form n-wells in the regions from which said silicon nitride was removed,
   (g) diffusing in n-doping ions into said substrate while simultaneously oxidizing the surfaces of said n-wells to form oxide masks,
   (h) removing said silicon nitride layer and performing deep channel implantation of boron ions into said substrate through said oxide masks,
   (i) applying a double layer of silicon dioxide and silicon nitride over said substrate,
   (j) structuring said silicon nitride layer to open the active regions and selectively masking by photoresist selected regions of the opened area,
   (k) implanting boron ions through the masks provided in step (j) to dope the field oxide regions of the n-channel transistors to be formed,
   (l) removing the photoresist mask provided in step (j) and locally oxidizing said substrate to form field oxide regions for separating the active transistor regions of said substrate, utilizing the silicon nitride applied in step (i) as a mask,
   (l') applying a photoresist mask to define the base of the bipolar transistor,
   (m) implanting boron ions to form base zones in the bipolar transistor region,
   (n) removing the photoresist mask and oxidizing the substrate surface-wide to produce a gate oxide thereon,
   (o) implanting boron ions surface-wide to dope the channel regions of the n-channel and p-channel MOS transistors,
   (p) depositing a gate material surface-wide to provide the gate electrodes of said MOS transistors,
   (q) vapor depositing a surface-wide layer of silicon dioxide to form an intermediate oxide,
   (r) selectively implanting n-doping ions to form source/drain regions of the n-channel transistors and the n+ emitter and the n+ collector contact of the bipolar transistors having masked before all other regions by photoresist,
   (s) selectively implanting boron ions to form source/drain regions of the p-channel transistors and the p+ base contact of the bipolar transistors having masked before all other regions by photoresist, and
   (t) removing the photoresist mask, etching the contact holes, and performing usual metallization technique.

2. A method according to claim 1 wherein said silicon substrate is a p-doped (100) oriented substrate having a specific electrical resistance of about 20 ohm cm.

3. A method according to claim 1 wherein said silicon substrate is a highly p-doped (100) oriented substrate covered by a low p-doped (100) oriented epitaxial layer.

4. A method according to claim 1 which includes the further step of applying a p-doped epitaxial layer surface-wide over said substrate after producing buried n+-doped zones in said substrate prior to step (b).

5. A method according to claim 1 wherein said double insulation layer of step (b) consists of a thermally produced layer of $SiO_2$ of about 50 nm thickness and a vapor phase deposited layer of silicon nitride having a thickness of about 140 nm.

6. A method according to claim 1 wherein said deep implantation of step (d) is performed with phosphorus ions at a dosage of about $3 \times 10^{15}$ cm$^{-2}$, and at an energy level of about 80 keV.

7. A method according to claim 1 wherein said n-wells of step (f) are formed by implanting phosphorus ions at a dosage of about $2 \times 10^{12}$ cm$^{-2}$ and at an energy level of about 180 keV.

8. A method according to claim 1 wherein said diffusion is carried out such that the n-doping ions of step (g) penetrate at least 2.5 microns into the p-doped silicon substrate.

9. A method according to claim 1 wherein said deep channel implantation of step (h) takes place at a dosage of about $8 \times 10^{11}$ cm$^{-2}$ and at a dosage level of about 60 keV.

10. A method according to claim 1 wherein said n-channel field implantation of step (k) is carried out at a dosage of about $1.2 \times 10^{13}$ cm$^{-2}$ and at an energy level of about 25 keV.

11. A method according to claim 1 wherein the implanting with boron ions according to step (m) is carried out at a dosage of about $9 \times 10^{13}$ cm$^{-2}$ and at an energy level of about 80 keV.

12. A method according to claim 1 wherein the gate oxidation of step (n) is carried out to produce a gate oxide thickness in the range from 10 to 25 nm.

13. A method according to claim 1 wherein the surface-wide boron channel ion implantation of step (o) is carried out at a dosage level of $2 \times 10^{11}$ cm$^{-2}$ and at an energy level of 25 keV.

14. A method according to claim 1 wherein said gate material deposited in step (p) consists of a refractory metal, a refractory metal silicide, or double layers of polysilicon and silicides.

15. A method according to claim 1 wherein the deposition of said silicon dioxide in step (q) is accomplished by thermal decomposition of tetraethyl orthosilicate and deposited to a thickness of from 50 to 200 nm.

16. A method according to claim 1 in which the source/drain regions of step (r) are produced on an $SiO_2$ layer of about 100 nm thickness with phosphorus implantation at a dosage level of $8 \times 10^{15}$ cm$^{-2}$ and an energy level of about 80 keV.

17. A method according to claim 1 in which the source/drain regions of step (s) are produced on an $SiO_2$ layer of about 100 nm thickness with boron implantation at a dosage of about $4 \times 10^{15}$ cm$^{-2}$ and an energy level of about 40 keV.

18. A method according to claim 1 wherein the source/drain regions of steps (r) and (s) are produced on an $SiO_2$ layer of about 70 nm thickness.

19. A method according to claim 3 wherein said silicon substrate has a specific electrical resistance of about 0.02 ohm cm and the said epitaxial layer has a specific electrical resistance of about 20 ohm cm.

20. A method according to claim 5 wherein said n$^+$-doped zones are produced by ion implantation with antimony at a dosage level of $3 \times 10^{15}$ cm$^{-2}$ and at an energy level of about 80 keV.

21. A method according to claim 4 wherein said p-doped epitaxial layer has a specific electrical resistance of about 20 ohm cm and a thickness of about 3 microns.

* * * * *